United States Patent
Lu et al.

(10) Patent No.: US 10,566,413 B2
(45) Date of Patent: Feb. 18, 2020

(54) MIM CAPACITOR CONTAINING NEGATIVE CAPACITANCE MATERIAL

(71) Applicant: QUALCOMM Incorporated, San Diego, CA (US)

(72) Inventors: Ye Lu, San Diego, CA (US); Junjing Bao, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/724,147

(22) Filed: Oct. 3, 2017

(65) Prior Publication Data

US 2019/0103459 A1 Apr. 4, 2019

(51) Int. Cl.

| | |
|---|---|
| *H01L 49/02* | (2006.01) |
| *H01L 21/321* | (2006.01) |
| *H01L 21/768* | (2006.01) |
| *H01L 27/11502* | (2017.01) |
| *H01L 27/108* | (2006.01) |
| *H01L 29/66* | (2006.01) |
| *H01L 23/522* | (2006.01) |

(Continued)

(52) U.S. Cl.
CPC .......... *H01L 28/40* (2013.01); *H01L 21/3212* (2013.01); *H01L 21/7684* (2013.01); *H01L 23/5222* (2013.01); *H01L 27/0808* (2013.01); *H01L 27/10852* (2013.01); *H01L 27/10894* (2013.01); *H01L 27/11502* (2013.01); *H01L 28/56* (2013.01); *H01L 29/66181* (2013.01); *H01L 29/66409* (2013.01); *H01L 29/94* (2013.01)

(58) Field of Classification Search
None
See application file for complete search history.

(56) References Cited

U.S. PATENT DOCUMENTS

| | | | |
|---|---|---|---|
| 2007/0152295 A1 | 7/2007 | Yeh et al. | |
| 2014/0355328 A1* | 12/2014 | Muller | G11C 11/2275 365/145 |
| 2015/0318285 A1 | 11/2015 | Zhang et al. | |

(Continued)

FOREIGN PATENT DOCUMENTS

| | | |
|---|---|---|
| CN | 105609503 A | 5/2016 |
| KR | 20140004855 A | 1/2014 |
| KR | 20160040356 A | 4/2016 |

OTHER PUBLICATIONS

Khan A.I., et al., "Negative Capacitance in a Ferroelectric Capacitor", Nature Materials, vol. 14, No. 2, Feb. 2015, pp. 182-186, XP055207150, ISSN: 1476-1122. DOI: 10.1038/nmat4148.

(Continued)

*Primary Examiner* — Mounir S Amer
(74) *Attorney, Agent, or Firm* — Qualcomm Incorporated

(57) ABSTRACT

A capacitor may include a first conductive layer forming a first capacitor plate, a second conductive layer forming a second capacitor plate, and a first insulating material on the first conductive layer. The first insulating material may include a positive capacitance material. The capacitor may further include a second insulating material disposed over the first insulating material and between the first insulating material and the second conductive layer. The second insulating material may include a negative capacitance ferroelectric material.

12 Claims, 8 Drawing Sheets

(51) Int. Cl.
  *H01L 29/94*  (2006.01)
  *H01L 27/08*  (2006.01)

(56) References Cited

U.S. PATENT DOCUMENTS

| 2016/0141366 | A1* | 5/2016 | Lai ..................... H01L 29/1033 |
| | | | 257/9 |
| 2017/0162250 | A1* | 6/2017 | Slesazeck ......... H01L 29/78391 |
| 2017/0271257 | A1 | 9/2017 | Zhu et al. |
| 2018/0166448 | A1 | 6/2018 | Cheng et al. |

OTHER PUBLICATIONS

Li K-S., et al., "Sub-60mV-Swing Negative-Capacitance FinFET without Hysteresis," International Electron Devices Meeting (IEDM), IEEE, 2015, pp. 22.6.1-22.6.4.

Then H.W., et al., "Experimental Observation and Physics of "Negative" Capacitance and Steeper than 40mV/decade Subthreshold Swing in Al0.83In0.17N/AlN/GaN MOS-HEMT on SiC Substrate," International Electron Devices Meeting (IEDM), IEEE, 2013, pp. 28.3.1-28.3.4.

Yeung C.W., et al., "Low Power Negative Capacitance FETs for Future Quantum-Well Body Technology," 2013 International Symposium on VLSI Technology, Systems, and Applications (VLSI-TSA), Apr. 22, 2013, 2 pages.

International Search Report and Written Opinion—PCT/US2018/052551—ISA/EPO—Jan. 17, 2019.

* cited by examiner

MIM CAPACITOR CONTAINING NEGATIVE CAPACITANCE MATERIAL

BACKGROUND

Field

Aspects of the present disclosure relate to semiconductor devices, and more particularly to a metal-insulator-metal (MIM) capacitor having a negative capacitance material.

Background

Capacitors are passive elements used in integrated circuits for storing an electrical charge. Capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a high-K dielectric material. Metal-insulator-metal (MIM) capacitors are one example of a parallel plate capacitor, in which the insulator is the dielectric, and the plates are made of a metal material.

MIM capacitors are frequently employed in semiconductor dies to provide capacitance to circuitry on the semiconductor die. MIM capacitors are increasingly used to improve the performance of devices that operate at higher frequencies. For example, MIM capacitors may be added to semiconductor dies having radio frequency (RF) circuitry to provide bypass capacitance. This usage of a capacitor may be referred to as a decoupling capacitor. A decoupling capacitor is a capacitor that decouples one portion of a circuit (e.g., an electrical network) from another portion of the circuit. In this arrangement, noise generated by other portions of the circuit is shunted through the capacitor, which reduces the effect of the noise on the remaining portions of the circuit. That is, a decoupling capacitor may be used to bypass a power supply or other high impedance component of the circuit.

As process technology advances, semiconductor chip sizes decrease, with an increasing number of components arranged in a smaller area. The capacitance of a MIM capacitor is proportional to the area of its plates, so as the footprint of the MIM capacitor is reduced, its capacitance is decreased. There is a demand for smaller footprint MIM capacitors that have at least the same, if not a greater, capacitance as their larger predecessors.

SUMMARY

A capacitor may include a first conductive layer forming a first capacitor plate, a second conductive layer forming a second capacitor plate, and a first insulating material on the first conductive layer. The first insulating material may include a positive capacitance material. The capacitor may further include a second insulating material disposed over the first insulating material and between the first insulating material and the second conductive layer. The second insulating material may include a negative capacitance ferroelectric material.

A metal oxide semiconductor varactor may include a source region of a first polarity and a drain region of the first polarity. The varactor may further include a channel region of the first polarity between the source region and the drain region. The channel region may include a gate. The varactor may further include a first insulating material on the gate. The first insulating material may include a positive capacitance material. The varactor may further include a second insulating material disposed over the first insulating material and between the first insulating material and a conductive layer. The second insulating material may include a negative capacitance ferroelectric material.

A method of fabricating a capacitor may including depositing a first conductive layer. The method may further include depositing a first insulating material on the first conductive layer. The first insulating material may include a positive capacitance material. The method may further include depositing a second insulating material over the first insulating material. The second insulating material may include a negative capacitance ferroelectric material. The method may further include depositing a second conductive layer over the second insulating material.

A capacitor may include a first conductive layer forming a first capacitor plate, a second conductive layer forming a second capacitor plate and an insulating material on the first conductive layer. The insulating material may include a positive capacitance material. The capacitor may further include means for increasing a capacitance of the capacitor, disposed between the insulating material and the second conductive layer.

This has outlined, rather broadly, the features and technical advantages of the present disclosure that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of an aspect of the present disclosure, reference is now made to the following description taken in conjunction with the accompanying drawings.

DETAILED DESCRIPTION

Figure 1:
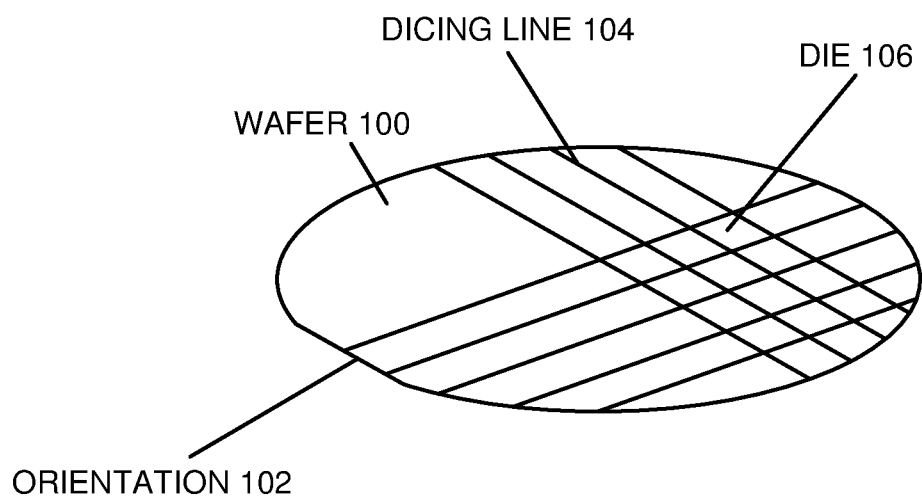
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "proximate" used throughout this description means "adjacent, very near, next to, or close to." As described herein, the term "on" used throughout this description means "directly on" in some configurations, and "indirectly on" in other configurations.

Parallel plate capacitors, such as MIM capacitors, are frequently employed in semiconductor dies to provide capacitance to circuitry on the semiconductor die. In addition, MIM capacitors are increasingly used to improve performance of devices that operate at increasingly higher frequencies. For example, MIM capacitors may be added to semiconductor dies having radio frequency (RF) circuitry to provide bypass capacitance. This usage of a capacitor may be referred to as a decoupling capacitor. A decoupling capacitor is a capacitor that decouples one portion of a circuit (e.g., an electrical network) from another portion of the circuit. In this arrangement, noise generated by other portions of the circuit is shunted through the capacitor, which reduces the effect of the noise on the remaining portions of the circuit. That is, a decoupling capacitor may be used to bypass a power supply or other high impedance component of the circuit.

Decoupling capacitors may be arranged at different levels (e.g., on-board, on-package, on-die, etc.) to collectively reduce dynamic voltage noise of different frequencies. On-die MIM capacitors, however, generally consume a large die area, since the capacitance of a MIM capacitor is proportional to the area of its plates. As process technology advances and semiconductor chip sizes decrease, so does the footprint of the MIM capacitor, however, the demand is that the capacitance of the smaller MIM capacitor remain the same, if not greater than, that of their larger predecessors.

Semiconductor fabrication processes are often divided into three parts: a front-end-of-line (FEOL), a middle-of-line (MOL) and a back-end-of-line (BEOL). Front-end-of-line processes include wafer preparation, isolation, well formation, gate patterning, spacers, and dopant implantation. A middle-of-line process includes gate and terminal contact formation. The gate and terminal contact formation of the middle-of-line process, however, is an increasingly challenging part of the fabrication flow, particularly for lithography patterning. Back-end-of-line processes include forming interconnects and dielectric layers for coupling to the FEOL devices. These interconnects may be fabricated with a dual damascene process using plasma-enhanced chemical vapor deposition (PECVD) deposited inter-layer dielectric (ILD) materials.

More recently, the number of interconnect levels for circuitry has substantially increased due to the large number of transistors that are now interconnected in a modern microprocessor. The increased number of interconnect levels for supporting the increased number of transistors involves more intricate middle-of-line processes to perform the gate and terminal contact formation.

According to aspects of the present disclosure, a capacitor is described in which a second insulating material, comprised of a negative capacitance ferroelectric material, is disposed over a first insulating material of the capacitor and between the first insulating material and a second conductive layer of the capacitor. The first insulating material is a conventional positive capacitance material, such as a high-k dielectric. The resulting capacitor effectively utilizes the negative capacitance ferroelectric material in series with the positive capacitance material to increase the effective capacitance of the capacitor without increasing the capacitor footprint. This enables a capacitor equipped with the negative capacitance ferroelectric material to have a greater capacitance than a similarly sized capacitor without the negative capacitance ferroelectric material.

According to an aspect of the present disclosure, a negative capacitance ferroelectric material is selected such that the absolute value of its capacitance is slightly larger than that of the positive capacitance material in the capacitor. For example, the negative capacitance material may have a capacitance $C2$ that has an absolute value that is 1.1 times that of the positive capacitance material, $C1$. A resulting capacitor that utilizes the negative capacitance material in series with the positive capacitance material would have a capacitance increase of 11 times that of a similarly sized capacitor containing only the positive capacitance material.

According to an aspect of the present disclosure, the negative capacitance material may include lead zirconate titanate (PZT), $HfZrO_2$, or polarized AlInN.

According to an aspect of the present disclosure, the capacitor may include a conductive layer between the first insulating material and the second insulating material. Alternatively, the second insulating material may be directly on the first insulating material. In addition, the capacitor may include multiple alternating layers of the first insulating material and the second insulating material.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to enhance electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
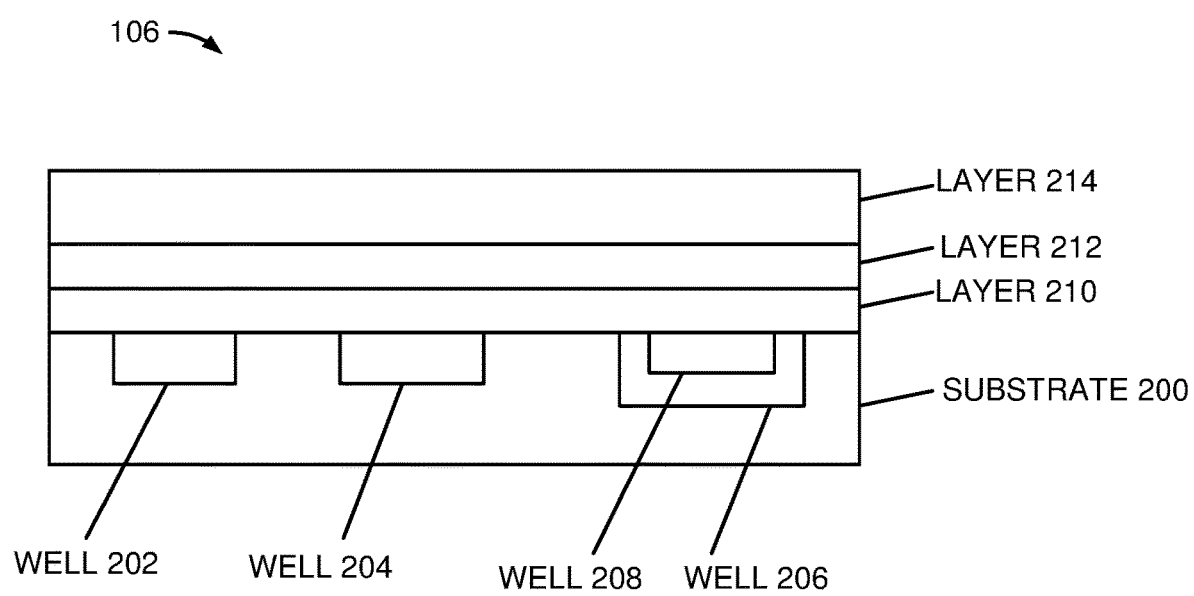
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
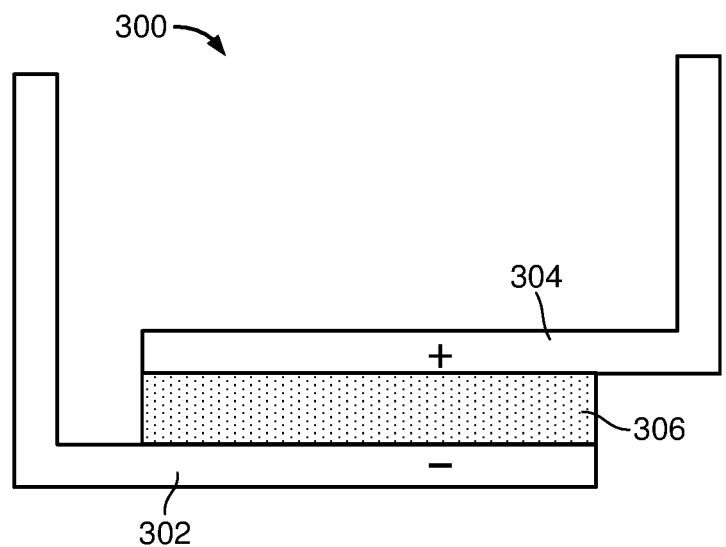
FIG. 3 illustrates a cross-sectional view of a conventional MIM capacitor structure.

FIG. 3 illustrates a cross-sectional view of a conventional MIM capacitor structure 300. The MIM capacitor 300 may be a decoupling capacitor, one that decouples one portion of a circuit (e.g., an electrical network) from another portion of the circuit. Decoupling capacitors may be arranged at different levels (e.g., on-board, on-package, on-die, etc.) to collectively reduce dynamic voltage noise of different frequencies.

The MIM capacitor 300 includes a first conductive layer 302 and a second conductive layer 304. The first conductive layer 302 forms a first capacitor plate, while the second conductive layer 304 forms a second capacitor plate. The first and second conductive layers 302, 304 may be composed of any suitable conductive material, such as copper, aluminum, or alloys of copper or aluminum.

The MIM capacitor 300 further includes an insulating material 306 disposed between the first conductive layer 302 and the second conductive layer 304. The insulating material 306 may be a positive capacitance material, often a high-K dielectric. Examples of high-K dielectric materials include hafnium dioxide, hafnium silicate, zirconium silicate, and zirconium dioxide.

The MIM capacitor 300 is an example of an electrical device used to store energy (e.g., charge) in an electrical field between closely spaced capacitor plates (e.g., first conductive layer 302 and second conductive layer 304) according to a capacitance value. This capacitance value provides a measure of the amount of charge stored by the capacitor at a certain voltage. The capacitance of a MIM capacitor is determined in part by the area of the capacitor plates and the particular insulating material. One way to increase the capacitance of a MIM capacitor is to enlarge the capacitor plates, but that increases the footprint of the capacitor when area on a semiconductor chip is at a premium. Another way of increasing the capacitance of a MIM capacitor is to select an insulating material with a higher thermal conductivity (K) value, however, high-K dielectrics are already used in conventional MIM capacitors. The MIM capacitor 300 has a first capacitance C1.

According to aspects of the present disclosure, a MIM capacitor that includes two insulating materials, a positive capacitance material and a negative capacitance ferroelectric material is provided. The negative capacitance ferroelectric material works in series with the positive capacitance material to significantly increase the effective MIM capacitance without increasing its footprint. In one example, the additional of a negative capacitance ferroelectric material may increase the effective MIM capacitance by at least 10 times without an increase in footprint.

Figure 4:
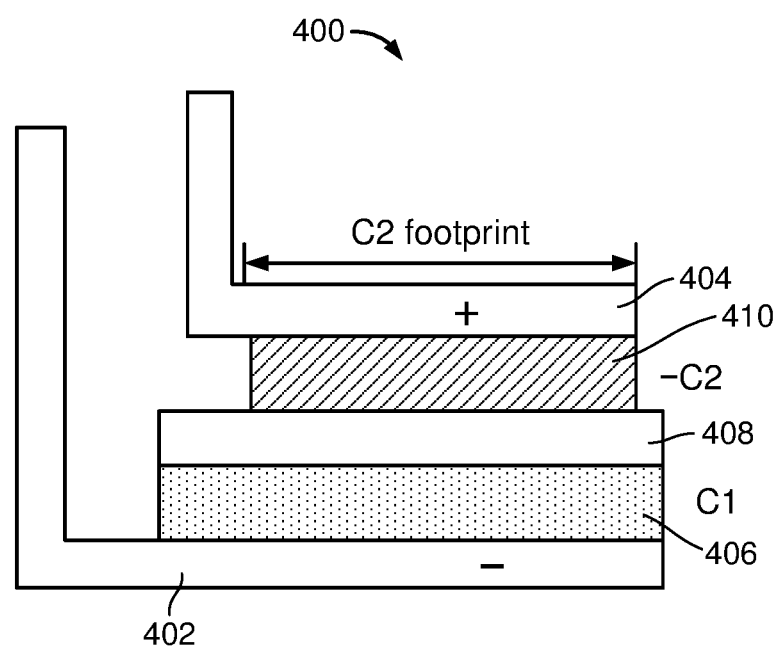
FIG. 4 illustrates a cross-sectional view of a MIM capacitor structure, according to an aspect of the present disclosure.

FIG. 4 illustrates a cross-sectional view of a MIM capacitor structure 400, according to aspects of the present disclosure. The MIM capacitor 400 may include a first conductive layer 402, a second conductive layer 404, and a first insulating material 406. The first conductive layer 402 forms a first capacitor plate, and the second conductive layer 404 forms a second capacitor plate. The first and second conductive layers 402, 404 may be composed of aluminum, copper, an alloy of aluminum or copper, or any other suitable conductive material.

The first insulating material 406 may be disposed on the first conductive layer 402. The first insulating material may be a positive capacitance material, such as a high-K dielectric. Exemplary high-K dielectrics may include hafnium dioxide, hafnium silicate, zirconium silicate, and zirconium dioxide.

The MIM capacitor 400 may further include a third conductive layer 408 and a second insulating material 410. The third conductive layer 408 may be disposed on the first insulating material 406 and composed of the same material as the first and second conductive layers 402, 404. As will be seen in later described embodiments, the third conductive layer 408 may be omitted from the MIM capacitor 400 without adversely impacting its capacitance.

The second insulating material 410 may be disposed over the first insulating material 406 and located between the first insulating material and the second conductive layer 404. In this embodiment, the second insulating material 410 is disposed on the third conductive layer 408, however, as will be seen in later embodiments, the second insulating material 410 may be disposed directly on the first insulating material 406.

The second insulating material 410 may be composed of a negative capacitance ferroelectric material. Certain ferroelectric materials exhibit a negative differential capacitance, such that when a voltage pulse is applied, the voltage across these certain ferroelectric materials will decrease with time. Exemplary negative capacitance ferroelectric materials may include lead zirconate titanate (PZT), $HfZrO_2$, and polarized AlInN.

By adding the third conductive layer 408 and second insulating material 410, the MIM capacitor structure 400 is equivalent to two capacitors connected in series. The first capacitor, which is similar to the MIM capacitor 300, has a first capacitance C1 and is comprised of the first conductive layer 402, first insulating material 406, and third conductive layer 408. The second capacitor has a second capacitance C2 and is comprised of the third conductive layer 408, second insulating material 408 and second conductive layer 404. The total capacitance Cnew of the MIM capacitor 400 is $$Cnew = \frac{C1 * |C2|}{|C2| - C1},$$

where |C2| is the absolute value of the second capacitor's capacitance, since capacitance C2 may be a negative value. The capacitance ratio of the MIM capacitor 400 to the to the MIM capacitor 300 is, therefore, $$\frac{Cnew}{C1} = \frac{|C2|}{|C2| - C1}$$

To maximize the increased capacitance of the MIM capacitor 400, the second insulating material 410, which is comprised of the negative capacitance ferroelectric material, may be selected such that the absolute value of the second capacitance |C2| is larger than, but close to, the first capacitance C1 of the first insulating material 406. For example, if |C2|=1.1*C1, then Cnew=11*C1, an increase of eleven times the first capacitance C1 of the first insulating material 406, all without any increase in the footprint of the MIM capacitor 400. Although the footprint of the second insulating material 410 on the third conductive layer 408 is illustrated as being smaller than the footprint of the first insulating material 406, the second insulating material 410 may have the same footprint as the first insulating material 406.

Figure 5A:
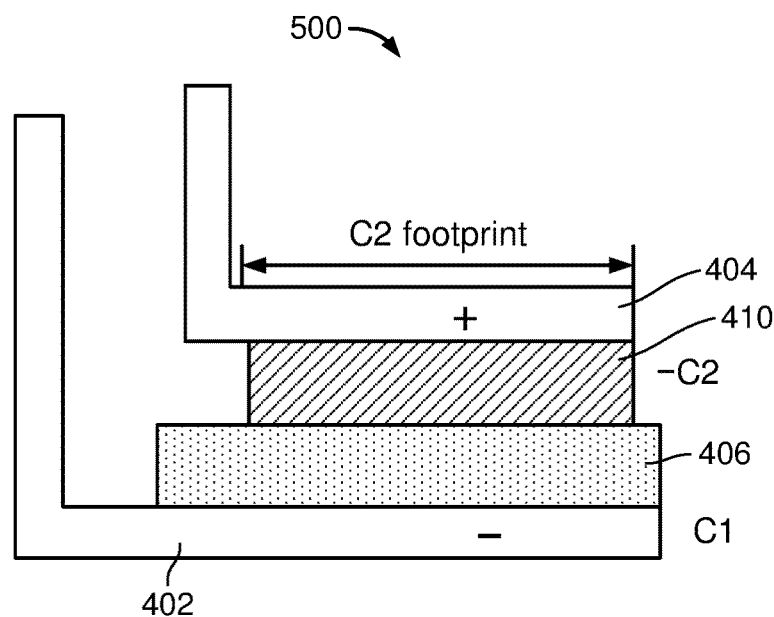
FIGS. 5A and 5B illustrate cross-section views of MIM capacitor structures, according to another aspect of the present disclosure.
Figure 5B:
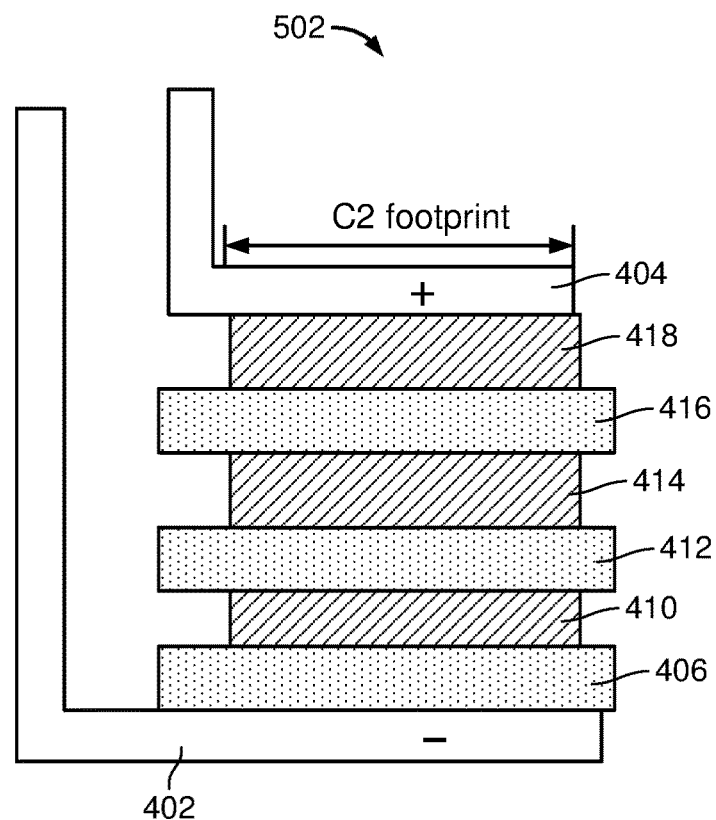

FIGS. 5A and 5B illustrate cross-sectional views of additional embodiments of MIM capacitor structures, according to aspects of the disclosure. In FIG. 5A, a MIM capacitor 500, similar to the MIM capacitor 400, is shown, and similar components are identified by the same reference numerals. The MIM capacitor 500 may include a first conductive layer 402 forming a first capacitor plate, a second conductive layer 404 forming a second capacitor plate, a first insulating material 406 and a second insulating material 410. The first insulating material 406, which may be a positive capacitance material, such as a high-K dielectric may be disposed on the first conductive layer 402. The MIM capacitor 500 differs from the MIM capacitor 400 in that the MIM capacitor 500 lacks a third conductive layer disposed between the first insulating material 406 and the second insulating material 410. Thus, the second insulating material 410 may be disposed directly on the first insulating material 406.

The second insulating material 410 may be composed of a negative capacitance ferroelectric material. Certain ferroelectric materials exhibit a negative differential capacitance, such that when a voltage pulse is applied, the voltage across these certain ferroelectric materials will decrease with time. Exemplary negative capacitance ferroelectric materials may include lead zirconate titanate (PZT), $HfZrO_2$, and polarized AlInN.

Even without a third conductive layer in between the first insulating material 406 and the second insulating material 410, the MIM capacitor 500 has a similar capacitance Cnew, where $$Cnew = \frac{C1 * |C2|}{|C2| - C1}$$

In FIG. 5B, a MIM capacitor 502 is shown including multiple, alternating layers of a positive capacitance material and a negative capacitance material. The MIM capacitor 500 may include a first conductive layer 402, a second conductive layer 404, a first insulating material 406 and a second insulating material 410. The first insulating material 406 may be disposed on the first conductive layer 402. The second insulating material 410 may be disposed on the first insulating material 406. The MIM capacitor 402 may further include a third insulating material 412 disposed on the second insulating material 410, and a fourth insulating material 414 disposed on the third insulating material 412, a fifth insulating material 416 disposed on the fourth insulating material 414, and a sixth insulating material 418 disposed on the fifth insulating material 416.

The first insulating material 406, the third insulating material 412 and the fifth insulating material 416 may be comprised of the same positive capacitance material, such as a high-K dielectric. Exemplary high-K dielectrics may include hafnium dioxide, hafnium silicate, zirconium silicate, and zirconium dioxide.

The second insulating material 410, the fourth insulating material 414 and the sixth insulating material 418 may be comprised of the same negative capacitance ferroelectric material. Exemplary negative capacitance ferroelectric materials may include lead zirconate titanate (PZT), $HfZrO_2$, and polarized AlInN.

Figure 6:
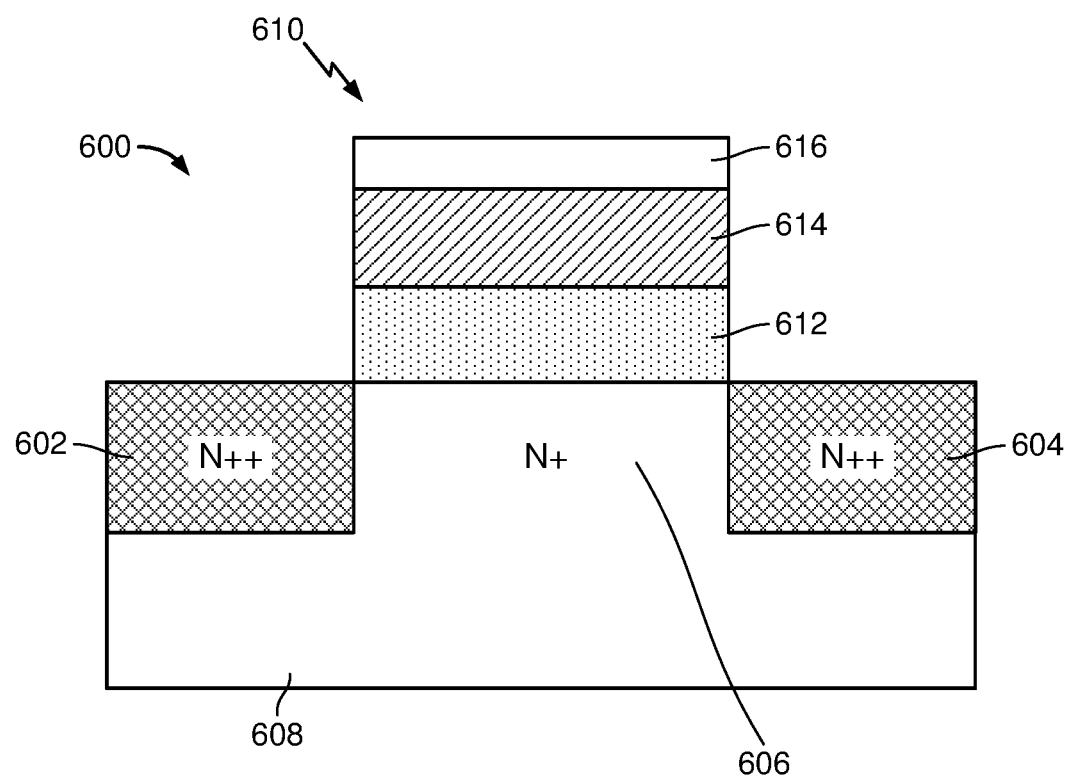
FIG. 6 illustrates a cross-sectional view of a metal oxide semiconductor (MOS) varactor including the capacitor structure of the present disclosure.

FIG. 6 illustrates a cross-sectional view of a metal oxide semiconductor (MOS) varactor 600, according to aspects of the present disclosure. A MOS varactor may provide a tunable capacitor. The MOS varactor 600 may include a source region 602, a drain region 604, and a channel region 606 between the source region 602 and the drain region 604. The source region 602 and the drain region 604 may each be doped with a first polarity (e.g., N++), and the channel region 606 may be doped with the first polarity (e.g., N+). The source region 602, the drain region 604 and the channel region 606 may be formed in a substrate 608. In addition, a gate 610 may be on the channel region 606.

To increase the capacitance of the MOS varactor 600, the gate 610 may include a first insulating material 612 disposed over the channel region 606, a second insulating material 614 disposed on the first insulating material 612, and a conductive layer 616 disposed over the second insulating material 614. The first insulating material 612 may be comprised of a positive capacitance material, such as a high-K dielectric. Exemplary high-K dielectrics may include hafnium dioxide, hafnium silicate, zirconium silicate, and zirconium dioxide. The second insulating material 614 may be comprised of a negative capacitance ferroelectric material. Exemplary negative capacitance ferroelectric materials may include lead zirconate titanate (PZT), $HfZrO_2$, and polarized AlInN The addition negative capacitance ferroelectric material to the gate 610 of MOS varactor 600 enables MOS varactor to have a higher capacitance than that of a similar MOS varactor without the second insulating material 614.

Figure 7:
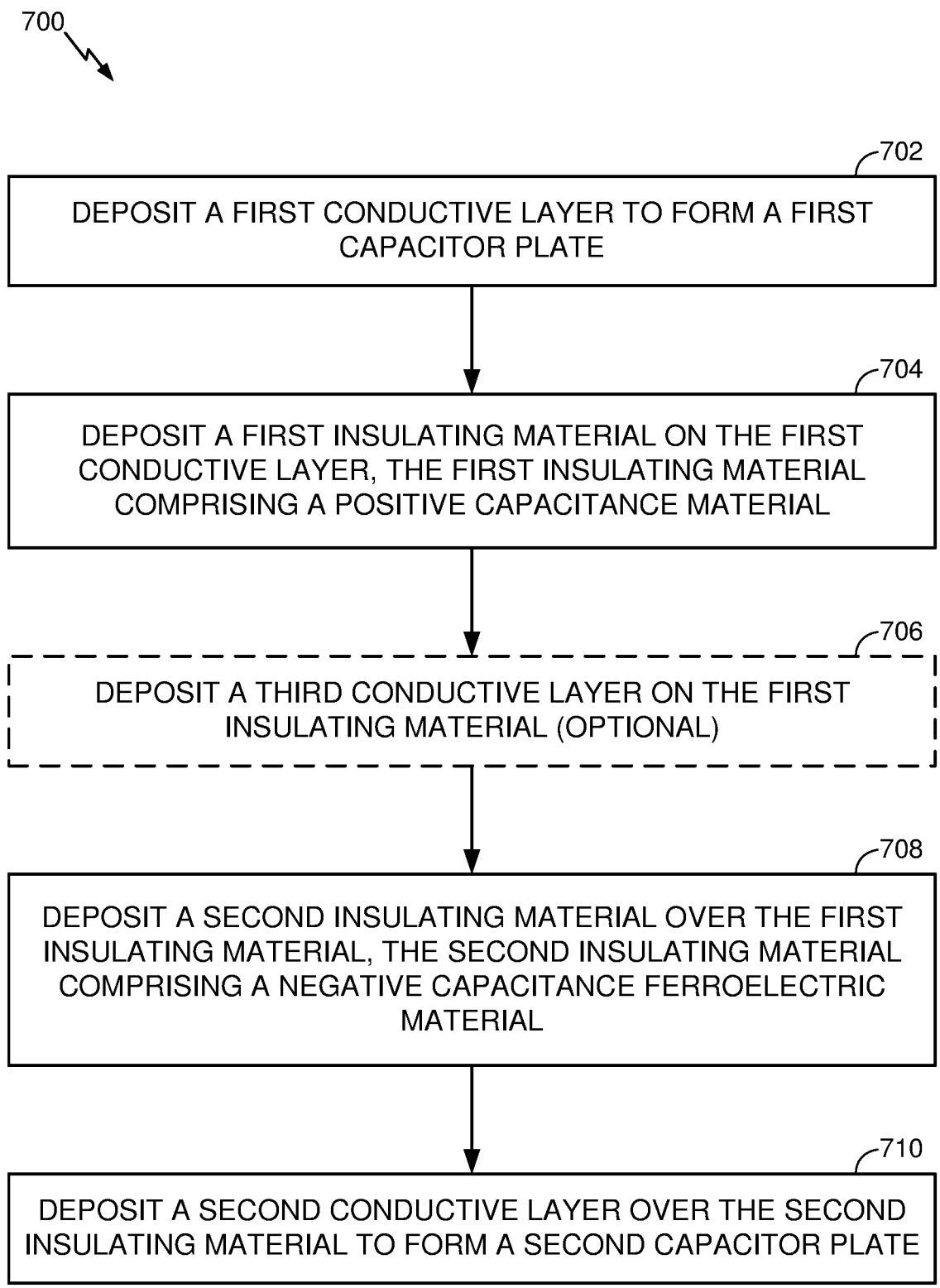
FIG. 7 illustrates a method of a fabricating a MIM capacitor structure in accordance with an aspect of the present disclosure.

FIG. 7 illustrates a method 700 of making a MIM capacitor structure 400, 500, 502 as illustrated in FIGS. 4 and 5A according to an aspect of the present disclosure. In block 702 a first conductive layer 402 may be deposited on a substrate 200. The first conductive layer 402 forms a first capacitor plate of the MIM capacitor 400, 500, 502. The first conductive layer 402 may be composed of aluminum, copper, an alloy of aluminum or copper, or any other suitable conductive material.

In block 704 a first insulating layer 406 may be deposited on the first conductive layer 402. The first insulating layer 406 may be comprised of a positive capacitance material, such as a high-K dielectric. Exemplary high-K dielectrics may include hafnium dioxide, hafnium silicate, zirconium silicate, and zirconium dioxide.

In block 706 an optional third conductive layer may be deposited on the first insulating material 408, as illustrated in FIG. 4. The third conductive layer 408 may be composed of aluminum, copper, an alloy of aluminum or copper, or any other suitable conductive material. As discussed earlier, this step may be omitted, in which the method 700 would proceed from block 704 directly to block 708.

In block 708, a second insulating material 410 may be deposited over the first insulating material 406. If the step at block 706 was performed, then the second insulating material 410 may be deposited directly on the third conductive layer 408 as illustrated in FIG. 4. If the step at block 706 was omitted, then the second insulating material 410 may be deposited directly on the first insulating material 406, as illustrated in FIGS. 5A and 5B.

The second insulating material may be composed of a negative capacitance ferroelectric material. Certain ferroelectric materials exhibit a negative differential capacitance, such that when a voltage pulse is applied, the voltage across these certain ferroelectric materials will decrease with time. Exemplary negative capacitance ferroelectric materials may include lead zirconate titanate (PZT), $HfZrO_2$, and polarized AlInN.

Optionally, additional alternating layers of the positive capacitance material and the negative capacitance ferroelectric material may be deposited on the second insulating material 410 to form the MIM capacitor 502 illustrated in FIG. 5B. Once the desired number of alternating layers have been deposited, the method 700 proceeds to block 710.

In block 710 a second conductive layer 404 may be deposited over the second insulating material 410 to complete the MIM capacitor 400, 500, 502 shown in FIGS. 4, 5A and 5B. The second conductive layer 404 forms a second capacitor plate. The second conductive layer 404 may be comprised of a positive capacitance material, such as a high-K dielectric. Exemplary high-K dielectrics may include hafnium dioxide, hafnium silicate, zirconium silicate, and zirconium dioxide.

According to an aspect of the present disclosure, a capacitor is described. In one configuration, the capacitor includes a first conductive layer forming a first capacitor plate, a second conductive layer forming a second capacitor plate, an insulating material on the first conductive layer, and means for increasing a capacitance of the capacitor, disposed between the insulating material and the second conductive layer. The means for increasing the capacitance may be a second insulating layer comprised of a negative capacitance ferroelectric material. In another aspect, the aforementioned means may be any module or apparatus or material configured to perform the functions recited by the aforementioned means.

Figure 8:
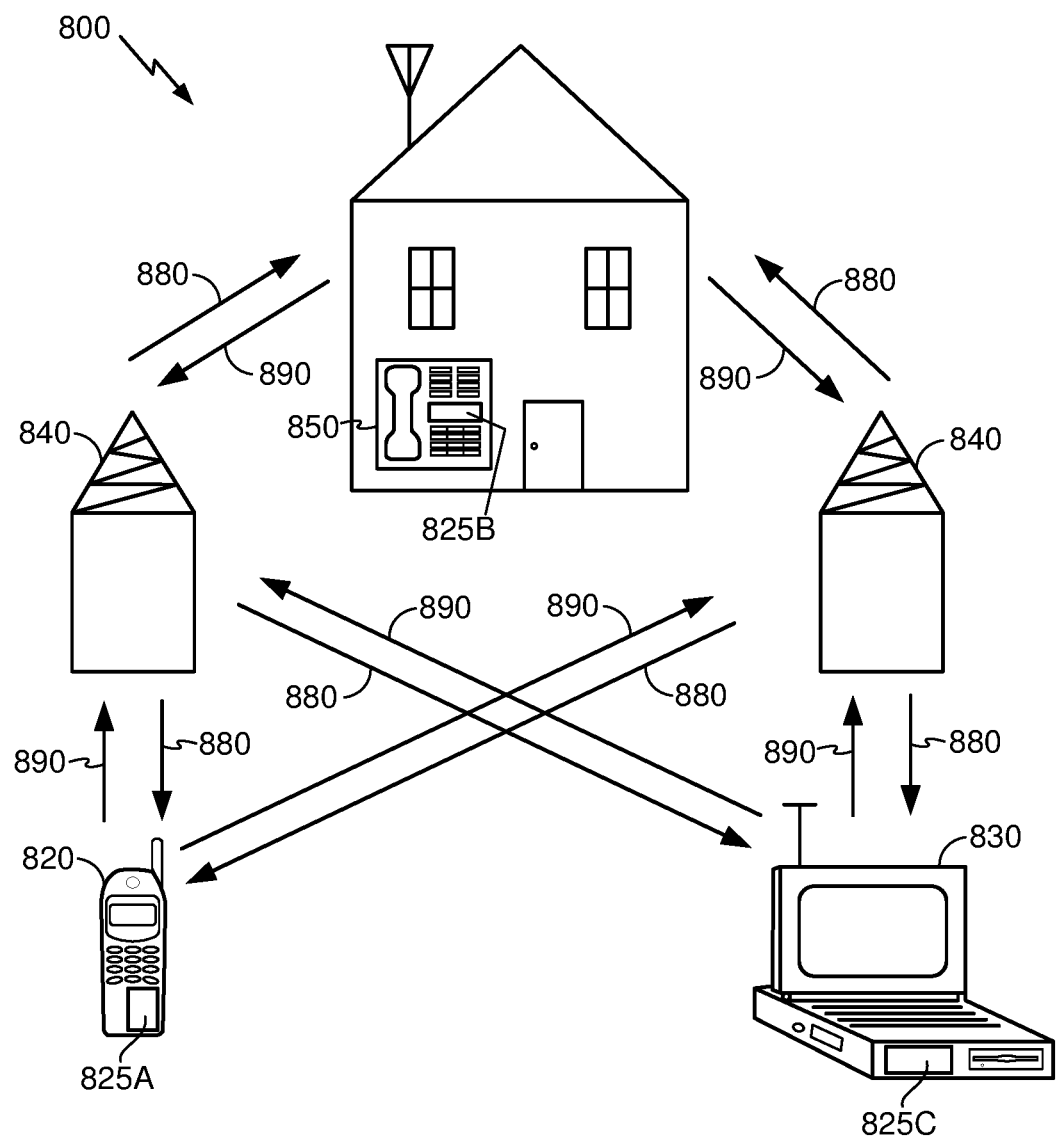
FIG. 8 is a block diagram showing an exemplary wireless communication system in which an aspect of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed MIM capacitors. It will be recognized that other devices may also include the disclosed MIM capacitors, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, or other devices that store or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed MIM capacitors.

Figure 9:
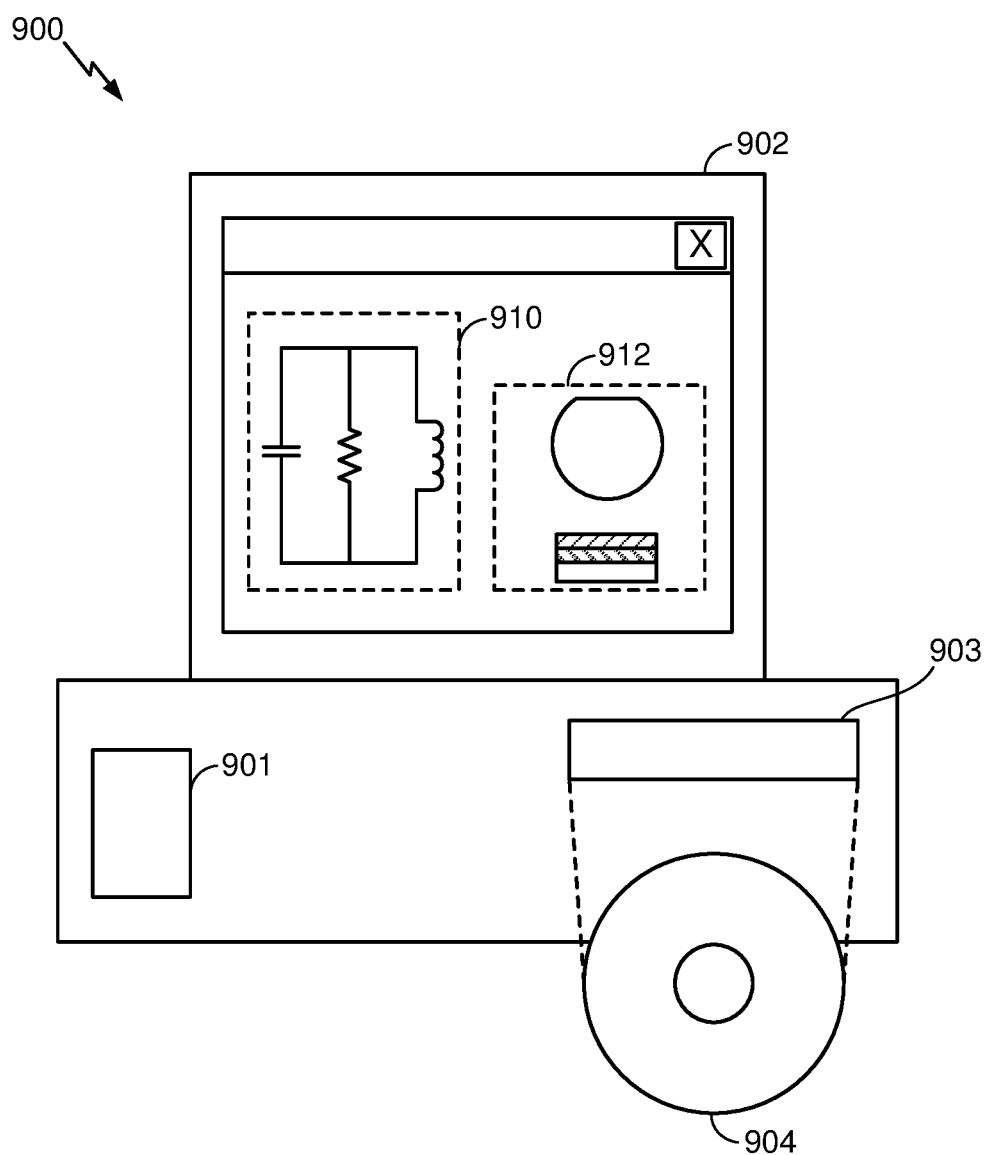
FIG. 9 is a block diagram illustrating a design workstation used for circuit, layout, and logic design of a MIM capacitor structure according to one configuration.

FIG. 9 is a block diagram illustrating a design workstation used for circuit, layout, and logic design of the MIM capacitor devices disclosed above. A design workstation 900 includes a hard disk 901 containing operating system software, support files, and design software such as Cadence or OrCAD. The design workstation 900 also includes a display 902 to facilitate design of a circuit 910 or a MIM capacitor structure 912. A storage medium 904 is provided for tangibly storing the design of the circuit 910 or the decoupling capacitor structure 912. The design of the circuit 910 or the MIM capacitor structure 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the MIM capacitor structure 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A capacitor comprising:
   a first conductive layer forming a first capacitor plate;
   a second conductive layer forming a second capacitor plate;
   a first insulating material on the first conductive layer, the first insulating material comprising a positive capacitance material;
   a second insulating material disposed directly on the first insulating material and between the first insulating material and the second conductive layer, the second insulating material comprising a negative capacitance ferroelectric material;
   a third insulating material on the second insulating material, the third insulating material comprising the positive capacitance material; and
   a fourth insulating material on the third insulating material, the fourth insulating material comprising the negative capacitance ferroelectric material.

2. The capacitor of claim 1, wherein the positive capacitance material is a high-k dielectric material.

3. The capacitor of claim 1, wherein an absolute value of a capacitance of the negative capacitance ferroelectric material is greater than a capacitance of the positive capacitance material.

4. The capacitor of claim 1, wherein the negative capacitance ferroelectric material is lead zirconate titanate (PZT).

5. The capacitor of claim 1, wherein the negative capacitance ferroelectric material is $HfZrO_2$.

6. The capacitor of claim 1, wherein the negative capacitance ferroelectric material is polarized AlInN.

7. The capacitor of claim 1, integrated into a mobile phone, a set top box, a music player, a video player, an entertainment unit, a navigation device, a computer, a hand-held personal communication systems (PCS) unit, a portable data unit, and/or a fixed location data unit.

8. A metal oxide semiconductor (MOS) varactor comprising:
   a source region of a first polarity;
   a drain region of the first polarity;

a channel region of the first polarity between the source region and the drain region, the channel region including a gate;

a first insulating material on the gate, the first insulating material comprising a positive capacitance material;

a second insulating material disposed over the first insulating material and between the first insulating material and a conductive layer, the second insulating material comprising a negative capacitance ferroelectric material a third insulating material on the second insulating material, the third insulating material comprising the positive capacitance material; and a fourth insulating material on the third insulating material, the fourth insulating material comprising the negative capacitance ferroelectric material.

9. The MOS varactor of claim 8, wherein the positive capacitance material is a high-k dielectric material.

10. The MOS varactor of claim 8, an absolute value of a capacitance of the negative capacitance ferroelectric material is greater than a capacitance of the positive capacitance material.

11. The MOS varactor of claim 8, wherein the negative capacitance ferroelectric material is selected from the group consisting of lead zirconate titanate (PZT), $HfZrO_2$ and AlInN.

12. The MOS varactor of claim 8, integrated into a mobile phone, a set top box, a music player, a video player, an entertainment unit, a navigation device, a computer, a hand-held personal communication systems (PCS) unit, a portable data unit, and/or a fixed location data unit.

* * * * *